United States Patent [19]
Solomon

[11] Patent Number: 4,794,092
[45] Date of Patent: Dec. 27, 1988

[54] SINGLE WAFER MOATED PROCESS

[75] Inventor: Allen L. Solomon, Fullerton, Calif.

[73] Assignee: Grumman Aerospace Corporation, Bethpage, N.Y.

[21] Appl. No.: 122,178

[22] Filed: Nov. 18, 1987

[51] Int. Cl.⁴ .............................................. H01L 21/76
[52] U.S. Cl. ........................................ 437/51; 437/48; 437/67; 437/225; 437/3; 148/DIG. 135; 148/DIG. 164; 357/30
[58] Field of Search ...................... 437/208, 23, 48, 49, 437/50, 51, 67, 3, 53, 225; 148/DIG. 135, DIG. 164; 156/630, 632, 633, 636, 646; 250/211 R, 332; 357/30, 32, 41, 45

[56] References Cited

U.S. PATENT DOCUMENTS

| | | | |
|---|---|---|---|
| 3,352,730 | 11/1967 | Murch, Jr. ........................ | 156/632 |
| 4,040,169 | 8/1977 | Rose ................................. | 437/3 |
| 4,403,238 | 9/1983 | Clark ................................ | 357/30 |
| 4,468,857 | 9/1984 | Christian et al. ............... | 156/632 X |
| 4,551,629 | 11/1985 | Carson et al. .................... | 250/578 |
| 4,618,763 | 10/1986 | Schmitz ........................... | 250/211 R |
| 4,624,047 | 11/1986 | Tani ................................. | 148/DIG. 135 |

Primary Examiner—Brian E. Hearn
Assistant Examiner—T. N. Quach
Attorney, Agent, or Firm—Stetina & Brunda

[57] ABSTRACT

The present invention is directed to the construction of an integrated circuit chip, and to the method of making such a chip from a plate or wafer. In accordance with the present invention a chip is formed to have conductive edge portions disposed on an insulator surface, which portions optionally may further be expanded into a pad. The insulating material electrically isolates the conductive edge portions from the semiconductive body of the chip. The invention may be implemented in redundant fashion to effect a multiplicity of electrical connections to a set of bulk semiconductor integrated circuits formed on the wafer.

Each exposed conductive portion on a chip edge and its optional surrounding conductive pad may be reliably surrounded by insulator so that electrical shorts to non-insulating regions are not experienced. By this edge surface structure integrated circuit elements may be stacked in an array, and electrically connected at the edge surfaces thereof, without hazard that any electrical regions of the integrated circuit elements may be contacted, save intentionally through a conductive lead or film connected to the pads.

18 Claims, 5 Drawing Sheets

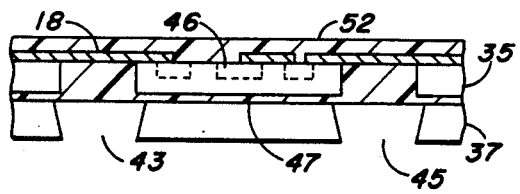
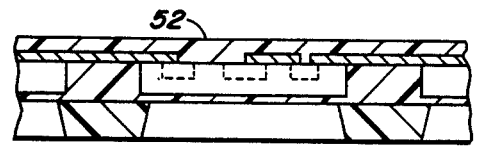
FIG. 4A  FIG. 4B
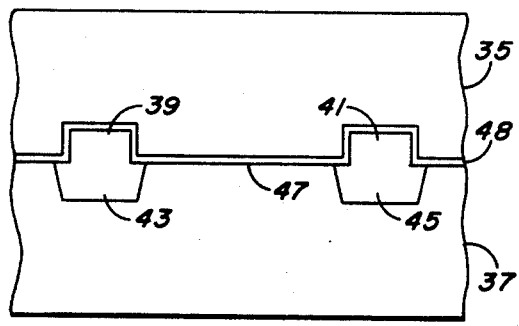
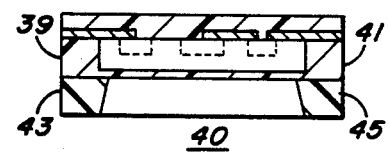
FIG. 5A  FIG. 4C
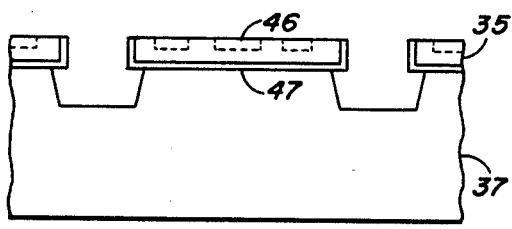
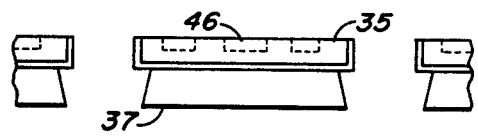
FIG. 5B  FIG. 5C
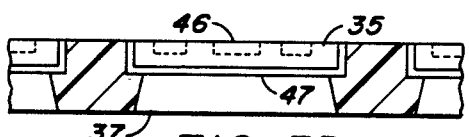
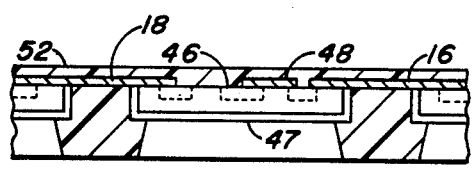
FIG. 5D  FIG. 5E
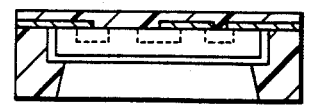
FIG. 5F

SINGLE WAFER MOATED PROCESS

BACKGROUND OF THE INVENTION

The present invention finds application in connection with thin silicon plates or wafers formed to support a multiplicity of monolithically integrated data processor circuits. More particularly, the invention is directed to the production of circuits formed on silicon wafers to include conductive pads or films formed on at least one edge thereof, with the remaining portion of that edge being insulated from the silicon material. The wafers may be stacked and adhesively bonded to form a data processor module that can be bump bonded to an input source, e.g., an infrared detector array, connected to the module along the edge portions thereof. Conductive pads formed on the edge portions of the wafers opposite to the input source can be similarly bump bonded to an array of connector contacts such as a pin grid array or a printed circuit board. A plurality of modules can be joined together and interconnected electrically to form an assembly, e.g. an infrared detector processor assembly.

Though silicon wafers formed in accordance with the present invention may have application in a variety of different areas, the present invention is described in connection with the production of modules for spaceborne infrared detection systems, wherein particular requirements with respect to space, size and ability to operate in extremely low temperature environments present criteria for which the present invention has particular advantages. In view of the space and weight limitations imposed on objects designed to be placed in space there is a particular need to develop processing modules and connecting devices that can reliably operate without imposing substantial weight or space penalties on the payload.

In order to provide accurate detection and resolution of objects characterized by an infrared signature, it is typically necessary to employ detection systems having a large number of discrete detector elements. The detector elements are interconnected to form a detector array, which in turn is connected to circuitry to allow the array to "scan" or "stare" over a substantial field of view. Accordingly, each of the detector elements must be electrically connected to processing circuitry in a manner wherein signals from adjacent detector elements may be separately detected and processed. Because the detector elements are small and very closely spaced, e.g., 0.003 inches center to center spacing, the circuitry for processing signals from the detector elements must conform to similar size and space limitations. Many conventional schemes for connecting detector elements to the processing circuitry are unsuitable to provide the required isolation, and reliability. Moreover, production techniques for connecting the individual detector elements to dedicated processing circuitry are typically expensive, tedious and characterized by a low degree of reliability.

The technique for connecting infrared detector elements and the dedicated processing circuitry requires that the inputs and outputs of the processor circuits be electrically isolated. When the processor circuits are formed on stacked silicon wafers, it is necessary to isolate the conductive edge portion from the active circuitry formed on the silicon wafer (to prevent undesired communication between the inputs or outputs and the processor circuit). Previous disclosures modify the vertical edge portions of the semiconductor wafers after the wafer has been fabricated and the plates are cut therefrom, to form a non-conductive region on the edges of the finished wafers to provide this isolation. For example, U.S. Pat. No. 4,551,629, to Carson et al, teaches that stacked wafer, i.e. silicon integrated circuits, may be connected to a detector array by selectively etching between metallized edge portions of the semiconductor wafers and then refilling the etch removed material with an insulator. The technique for selectively etching and backfilling edge portions of such small, thin wafers is tedious, expensive and difficult.

U.S. Pat. No. 4,618,763 to Schmitz, assigned to the common assignee, discloses that a wafer construction formed of epitaxially grown silicon formed on an insulator sapphire base. The silicon is removed from the sapphire near the edge portion to provide an insulator substrate for isolated conductive film leads. Though feasible, this construction utilizes integrated circuit technology that is less practiced than that of using a bulk silicon substrate. Additionally, because the sapphire substrate is harder and more difficult to produce than silicon, it is more difficult to grind the wafer to the required thinness necessary to form a high density processor channel module and it is more expensive.

The present invention is directed to a processor construction particularly suited for high density environments, where conductive end and edge portions may be isolated from the silicon material by the formation of insulator moats constructed in the course of the wafer fabrication process. The insulator moats are formed in the silicon wafer which, after appropriate thinning and sizing provides the desired insulator substrate end and edge portions of the wafers. Various techniques are disclosed for forming the insulator moats, and isolating the silicon from adjacent wafers in a wafer stack.

SUMMARY OF THE INVENTION

The present invention is directed to the construction of an integrated circuit chip, and to the method of making such a chip from a plate or wafer. In accordance with the present invention a chip is formed to have conductive edge portions disposed on an insulator surface, which portions optionally may further be expanded into a pad. The insulating material electrically isolates the conductive edge portions from the semiconductive body of the chip. The invention may be implemented in redundant fashion to effect a multiplicity of electrical connections to a set of bulk semiconductor integrated circuits formed on the wafer.

Each exposed conductive portion on a chip edge and its optional surrounding conductive pad may be reliably surrounded by insulator so that electrical shorts to non-insulating regions are not experienced. By this edge surface structure integrated circuit elements may be stacked in an array, and electrically connected at the edge surfaces thereof, without hazard that any electrical regions of the integrated circuit elements may be contacted, save intentionally through a conductive lead or film connected to the pads.

In accordance with the present invention, deep moats, or grooves, filled with insulator, are formed within a silicon plate or wafer during the course of its fabrication. Conductive material, formed as conductive leads, or conductive film is routed transversely onto the moat and upon the insulator therein. A further insulator layer is preferably provided upon the top of the conductive lead. The wafer is preferably thinned to remove any conductive or semiconductive substrate material below the moat, and to obtain a high density of stacked chips. The wafer is then cut so that lengthwise edge surfaces are defined by the moats. At these lengthwise edge surfaces only the butt ends of the conductive leads, completely surrounded by the insulator of the moat and by the insulator of the insulator layer are exposed. Regions of conductive materials, conductive pads, may optionally be formed upon the edge surface of the wafer in electrical communication with the conductive leads butt ends. Electrical connection to external electronics may be reliably made by abutment with the edge surface pads of each wafer plate.

Variations in accordance with the present invention are apparent. In one such variation a plurality of silicon wafers, each formed to include deep insulator moats, are bonded face to face. The bonded substrates are then thinned in order to expose moats or grooves and to create composite, or laminate, of silicon substrates of any desired degree of thickness.

BRIEF DESCRIPTION OF THE DRAWINGS

FIGS. 4(A-C) are side views of illustrating a second exemplary manner of forming a multiwafer chip in accordance with the present invention;

FIGS. 5(A-F) are side views illustrating a third exemplary manner of forming a third multiwafer chip in accordance with the present invention;

DETAILED DESCRIPTION OF THE PREFERRED EMBODIMENT

The detailed description set forth below in connection with the appended drawings is intended as a description of the presently preferred embodiments of the invention, and is not intended to represent the only form in which the present invention may be constructed or utilized. The description sets forth the functions and sequence of steps for construction of the invention in connection with the illustrated embodiments. It is to be understood, however, that the same, or equivalent functions and sequences may be accomplished by different embodiments that are also intended to be encompassed within the spirit and scope of the invention.

Figure 1A:
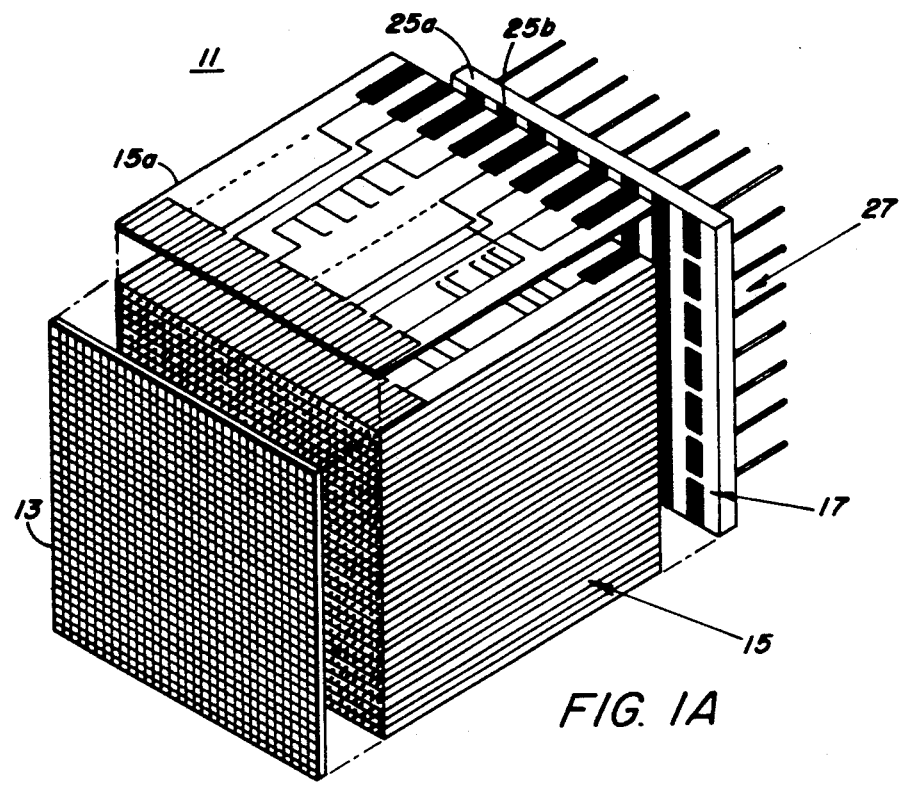
FIG. 1A is an exploded perspective view of an infrared detection system formed to include a plurality of stacked integrated circuits.
Figure 1B:
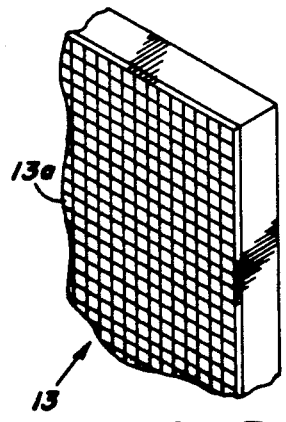
FIGS. 1B and 1C are enlarged sectional views of FIG. 1A.

Referring to the drawings, FIG. 1A illustrates a perspective view of one application including a plurality of integrated circuits, stacked to form a module, and connected to a detector array portion and an output connector board and pin grid array. As described more fully below, the integrated circuits may each be formed in accordance with the present invention. The assembly 11 set forth at FIG. 1A includes detector array portion 13, stacked integrated circuit module 15, connector board 17 and pin grid array 27. Detector array portion 13 is typically formed of a large number of individual detector elements, such as 13a as shown at FIG. 1B. Module 15 is formed of a plurality of individual integrated circuit layers, such as 15a, stacked one atop the next to collectively form the module 15. Each of the layers 15a is formed to support active circuitry for processing signals received from detector elements, e.g., detector for elements in the same horizontal plane as the layer 15a. Each integrated circuit layer typically includes processing circuitry such that each detector element in a detector array has a dedicated processor channel.

Figure 1C:
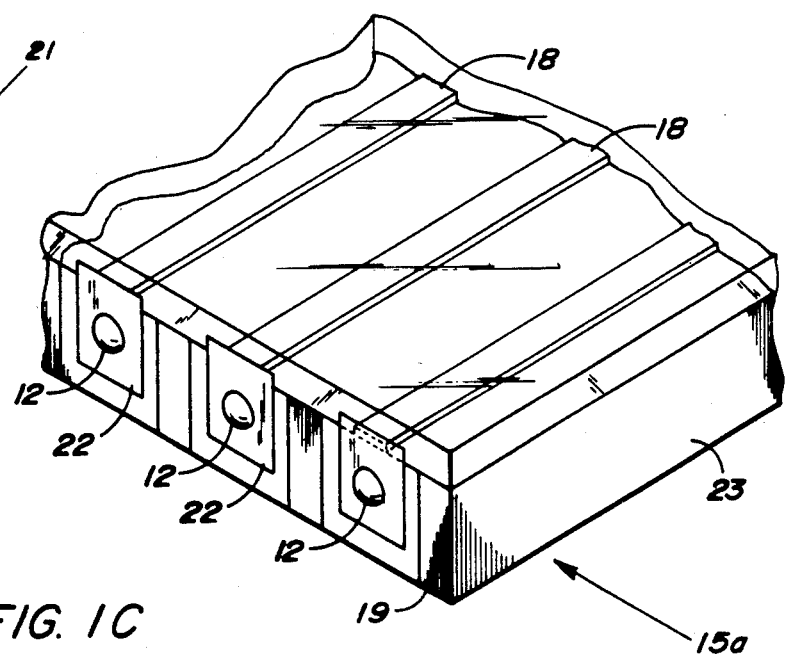

As shown at FIG. 1C edge portions of each of the individual integrated circuit layers, such as layer 15a, is formed to expose a plurality of input leads or conduits which communicate signals from an individual detector element to a dedicated active circuit portion of the integrated circuit, i.e. a doped semiconductive region. The input leads 18 are in electrical communication with conductive material formed on edge surface 19. Edge surface 19 may be provided with a region of conductive material such as a conductive pads 22 formed on edge surface 19 and in electrical communication with leads 18. Raised sections or bumps 12 are preferably formed on the outer surface of conductive pads 22 to facilitate connection between the input leads 18 and the associated detector element in detector array 13. Bumps 12 may be formed of indicium material or the like, applied to the surface of pads 22 in a conventional manner. Insulator coat 26 may be provided along the upper side surface of layer 15a. As further shown at FIG. 1B, the detector array 13 may further be provided with a buffer board 21 used to facilitate electrical connection between the detector array 13 and the input leads 18. As disclosed further in co-pending patent application No. 034,143, for Detector Interface Device, assigned to the common assignee, the buffer board 21 may also provide advantages in connection with the construction and testability of the detector array 13. As described more fully below the present invention provides an effective and reliable technique for allowing formation of pad 22 on edge surface 19 of the layer 15a, while isolating the conductive pads 22 from the silicon substrate 23 except through conductive leads 18. The present invention permits this isolation to be effected in the course of fabricating the layers 15a and does not require the further processing of layers 15a to backfill the insulator regions and expose leads 18 at the edge of layers 15a. The invention avoids the necessity of etching edge portions of the layer 15a and applying an insulator in the etched regions. Accordingly the present invention advantageously eliminates tedious steps associated with the manipulation of the layers after wafer fabrication.

Connector board 17 is preferably formed to provide a plurality of conductive regions 25a, 25b, etc. The conductive regions are each disposed in abutting electrical connection with the layers forming module 15. Though not described in detail below, it is to be understood that the principles of the present invention described in connection with electrical communication between the detector array 13 and the module 15, are equally applicable with respect to facilitating electrical communication between the module 15 and the connector board 17. Pin grid array 27 communicates signals from the conductive areas 25a, 25b, etc. to external circuitry where further processing occurs.

Figure 2:
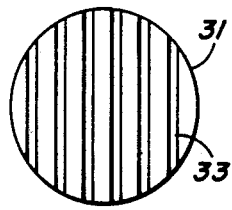
FIG. 2 is a top view of an exemplary silicon wafer used to form structures in accordance with the present invention.

As generally illustrated at FIG. 2 silicon wafer 31, used to form the integrated circuit layers 15a, may be constructed to have a plurality of moats or grooves 33 formed in a surface thereof. The moats 33 may be filled with an insulator material insulating edge portions of the chips as described more fully below. By application of the techniques described below silicon wafer 31 may produce a plurality of chips, each defined lengthwise by a pair of the grooves 33 and cut to the desired width.

Figure 3A:
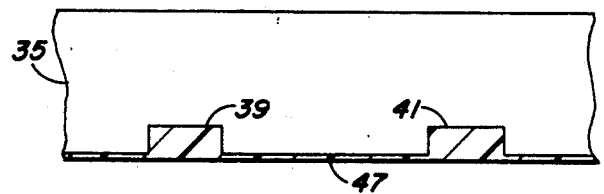
FIGS. 3(A-F) are side views illustrating a first exemplary manner of forming a chip in accordance with the present invention.
Figure 3A:
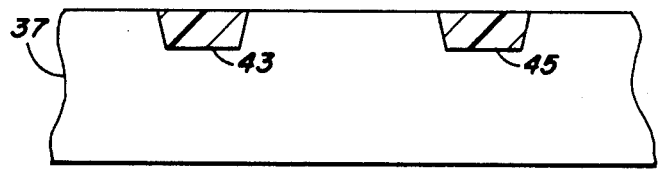

FIGS. 3A-F are cross-sectional views illustrating a first exemplary manner of forming a chip (layer 15a) in accordance with the present invention. FIGS. 3A-F illustrate a two wafer method, of forming a structure in accordance with the present invention. As shown at FIG. 3A wafers 35 and 37, which are typically silicon wafers, are each formed to have grooves 39, 41, 43 and 45 disposed on the opposing surfaces of the wafers. The grooves may be formed by any of a plurality of well known techniques including sawing or etching. One of the wafers, e.g., wafer 35, may further be provided with an insulating oxide coating 47 extending along a surface thereof. Grooves 39, 41, 43 and 45 may be filled with insulating material, e.g., silicon dioxide ($SiO_2$) as described more fully below.

Figure 3B:
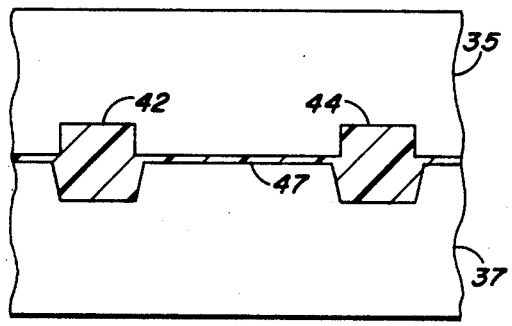
Figure 3C:
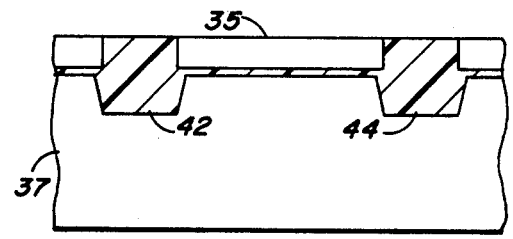

As shown at FIG. 3B wafer portions 35 and 37 may be joined together along their opposing surfaces. As wafers 35 and 37 are joined grooves 39, 41, 45 and 43, now filed with insulating material, are placed in abutting relationship to collectively form moats 42 and 44. As shown in FIG. 3C the top portion of wafer 35 is removed such that the silicon material 30 forming the principal portion of wafer 35, is bounded by insulating moats 42 and 44 and insulator layer 47, which is typically $SiO_2$.

Figure 3D:
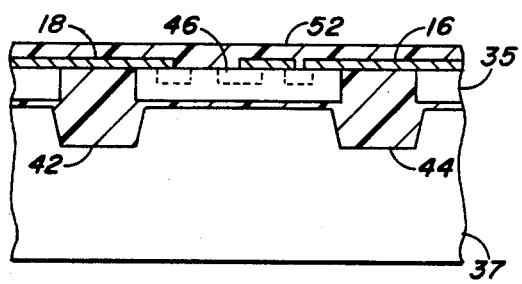

As shown in FIG. 3D active integrated circuitry is formed upon the surface of wafer portion 35 by the formation of doped regions 46. The doped regions 46 may be formed in accordance with conventional techniques for forming monolithic integrated circuitry in a semiconductive substrate. A pattern of conductive leads, 48 provides interconnection between doped regions 46, and extends across the moats 42 an 44. Conductive leads 48 may be formed of metal, polysilicon or other similarly conductive material. The input leads 18 and output leads 16 are disposed to be in electrical communication with active circuitry 46, extending over and beyond the insulating moats 42 and 44. An insulator coat 52 is provided on the upper surface of conductive portion 45. The insulator coat 52 may be formed of any of a number of well known insulating materials such as silicon dioxide or silicon nitride.

Figure 3E:
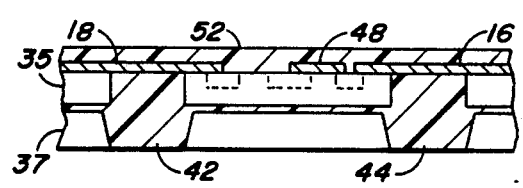
Figure 3F:
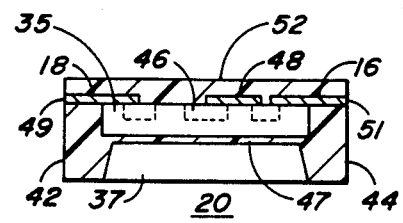

As shown in FIG. 3E silicon is then removed from the wafer 37, e.g. by grinding or lapping, to the required chip thickness. Enough silicon is removed such that the moats 42 and 44 extend to the lower surface of wafer 37. As shown at FIG. 3F, chips 20 or layers 15a are formed by cutting or sawing through the wafer across the moats 42 and 44. Except for leads 16 and 18, extending over moats 42 and 44, circuitry 46 is isolated from all other edge portions of the resulting composite chip 20.

Consequently, the circuitry 46 is isolated from electrical communication with any other circuit except via edge portions 49 and 51 of leads 16 and 18, respectively. Edge surfaces of the wafer may then be metalized, as shown at FIG. 1D to facilitate input to or output from the circuitry via leads 16 an 18. No etching, filling or other isolation techniques need be implemented to isolate the active circuitry from the input/output connectors.

As a consequence of the present invention multiple composite chips 20 may be adhesively stacked and connected to a detector array with fully isolated or insulated connections. Because the silicon body 35 is isolated from edge portions by moats 42 and 44 the input and output signals from the chip cannot be communicated to circuitry 46 except via connections to edge portions 49 and 51 of input and output leads 16 and 18. Accordingly, end portions of the composite chip 20 are isolated from the active circuitry 46 during the wafer fabrication process, i.e., by forming insulating moats 42 and 44, and by sizing the chip such that the moats 42 and 44 define the length of the chip. The upper surface of the chip 20 is isolated from the surrounding environment by means of insulator coat 52 or by the insulating adhesive used to stack chips 20. The silicon body 30 is further isolated from the lower silicon portion 37 of chip 20 by means of the insulating oxide layer 47. As described more fully below the invention may be constructed of one layer with the insulation provided insulator coat 52 on the top of the chip or by the insulator stack adhesive.

In the alternate construction illustrated at FIG. 4A, 4B and 4C the composite chip 40 is formed similar to the construction described above, except that insulating material is not deposited in grooves 43 and 45 of wafer 37 prior to joining wafers 35 and 37. Instead, after the composite chip has been trimmed to the required thickness, exposing grooves 43 and 45 they are filled with an insulating material, e.g., a glass or resin. As shown at FIG. 4C the resulting chip, after trimming the longitudinal edges, includes grooves 43 and 45 filled with insulator and grooves 39 and 41 having a body of silicon dioxide disposed therein.

FIGS. 5A, 5B and 5C illustrate another emodiment wherein the grooves are filled with glass or resin. Grooves 43, 45 are formed in the surface of wafer portion 37. The grooves 39, 41 are coated with a layer of insulating material, i.e., silicon dioxide, which extends as layer 47 across the surface of wafer 35. Layer 47 coats the interior of grooves 39 and 41. After the wafer portion 37 is thinned to the required thickness, as shown at FIG. 5C, the grooves 39, 41, 43 and 45 are filled with insulator material, e.g., glass or resin as shown at FIG. 5D. The application of conductive leads 16, 18, 48, insulating layer 52 and the trimming are illustrated at FIGS. 5E and 5F, and proceed as described above.

Figure 6A:
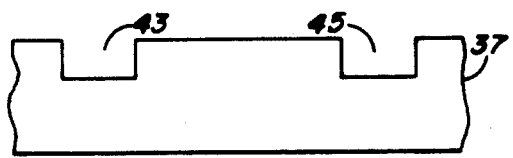
FIGS. 6(A-J) are side views illustrating a fourth exemplary manner of forming a multiwafer chip in accordance with the present invention.
Figure 6B:
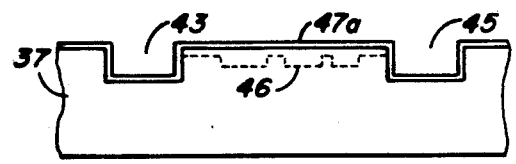
Figure 6C:
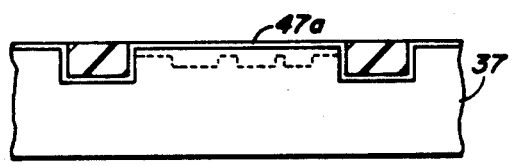
Figure 6D:
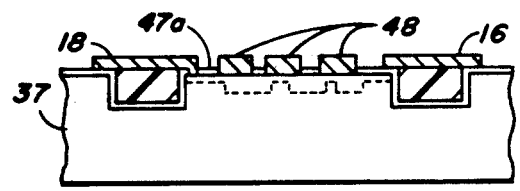
Figure 6E:
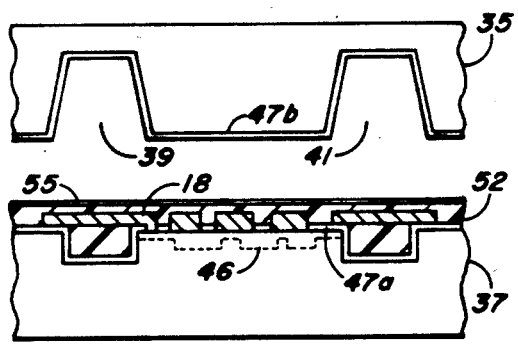
Figure 6F:
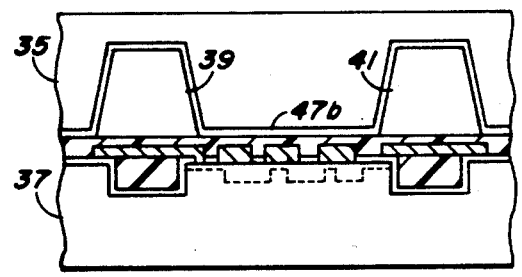
Figure 6G:
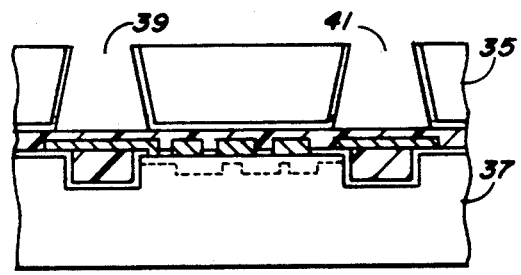
Figure 6H:
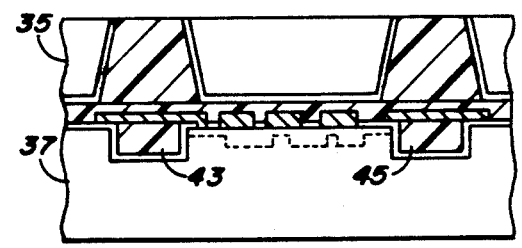
Figure 6I:
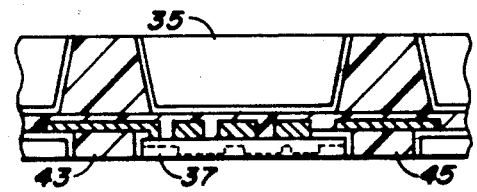
Figure 6J:
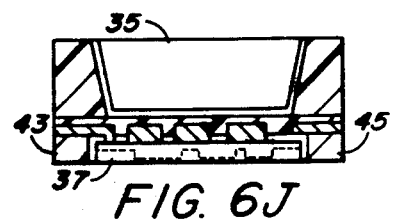

FIGS. 6A-J illustrate another insulated substrate construction wherein the active circuitry is sandwiched between the two silicon bodies. Parallel groves 43 and 45 are sawed in wafer 37 as shown at FIG. 6A. Active circuitry 46 is formed in the wafer and the wafer surface is coated with oxide 47a as shown at FIGS. 6B. Groves 43 and 45 are glass or resin filled as shown at FIG. 6C. Metal leads 16, 18, 48 are formed as shown at FIG. 6D. The layer 47a is selectively removed where the conductive leads 16, 18 and 48 are intended to contact the active circuitry 46. A second silicon wafer 35 with grooves 39 and 41 and oxide coat 47B is prepared as shown at FIG. 6E. A resin adhesive coat 55 applied to the upper surface of wafer 37 is also shown at FIG. 6E. The two wafers 35 and 37 are then adhesively bonded as shown at FIG. 6F. Wafer 35 is then thinned to expose grooves 39 and 41 as shown at FIG. 6G. The grooves 39 and 41 are resin filled as shown at FIG. 6H. Wafer 37 is thinned to expose moats 43 and 45 as shown at FIG. 6I. Chips are then sawed from the composite wafer to obtain chips with the structure as described above. This insulated substrate or two-wafer embodiment should result in a higher wafer fabrication yield since the circuit is formed and all high temperature processes are completed before the wafers are bonded and thinned. Further, since the grooves in either wafer can be made relatively deep, wafer thinning to expose the moats is less critical than in previously described composite substrate embodiments.

Each of the embodiments set forth in connection with FIGS. 3-6 has employed a technology utilizing a pair of semiconductive silicon wafers mated together to form a composite wafer. It is to be understood, however, that the features and advantages of the present invention may be obtained utilizing a single wafer construction. As described in connection with the remaining figures a single wafer may be provided with insulating moats to insulated edge portions of the chip, and upper insulating layers to insulate the top and portion of the chip. The insulating moats may be formed to have an oxide filling, such as silicon dioxide, or may be provided with glass or resin filling as previously described.

Figure 7A:
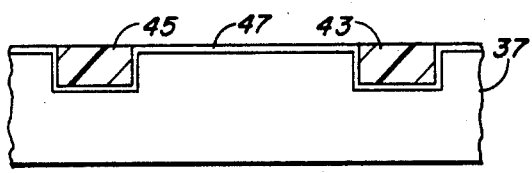
FIGS. 7(A-D) are side views illustrating a first exemplary manner of forming a single wafer chip in accordance with the present invention.
Figure 7B:
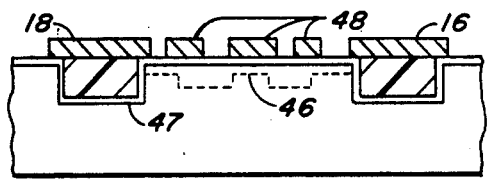
Figure 7C:
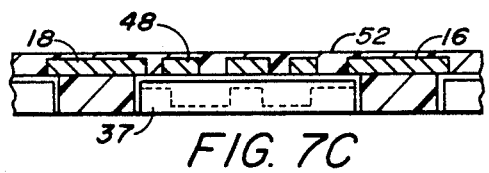
Figure 7D:
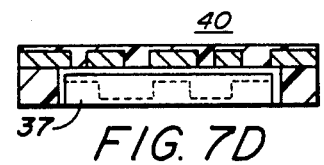

FIGS. 7A-D illustrate a single layer construction utilizing the teachings of the present invention. As shown at FIGS. 7A-C wafer 37 is provided with shallow grooves 43, 45. Oxide layer 47 is provided along the upper surface of the wafer portion 37, extending across grooves 43 and 45, which are then filled with an insulating material as described above. The layer 47 is selectively removed along the surface of wafer 37 to facilitate the formation of active circuitry 46 and conductive leads 16, 18, 48. As shown at FIGS. 7C and 7D the upper surface of wafer 37 is provided with a conductive and adhesive insulating layer 52 encasing the conductive leads 16, 18, 48. The wafer portion 37 is then thinned to the required thickness and the longitudinal edges sized as illustrated in FIGS. 7C and 8D. As with the composite substrate construction, the single layer chip may be provided with metalization pads on the edge surfaces thereof to connect the chip to a detector array and to a connector board. The chips formed in accordance with FIGS. 7A-7D may similarly be stacked to form a processor module which may be disposed in abutting electrical connection with a detector array.

Figure 8A:
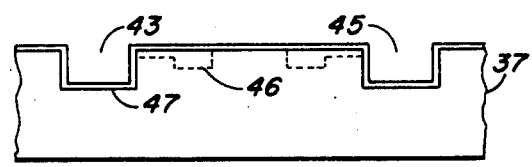
FIGS. 8(A-D) are side views illustrating a second exemplary manner of forming a single wafer chip in accordance with the present invention.
Figure 8B:
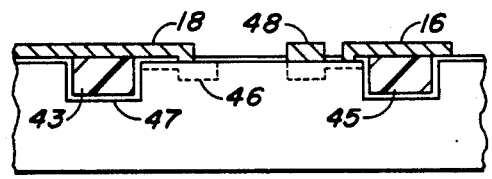
Figure 8C:
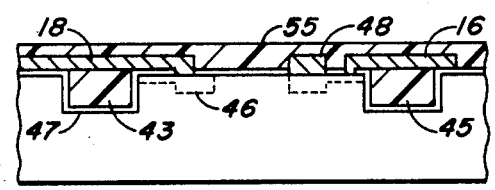
Figure 8D:
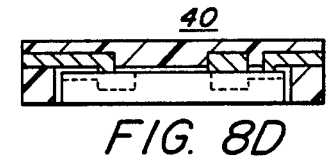

FIGS. 8A-D illustrate a similar construction technique to that disclosed in 7A-D, where the glass or resin is used to fill the moats rather than a high temperature resistant material and as $SiO_2$. As shown at FIG. 8A, grooves 43, 45 are cut in the wafer, active circuitry 46 is formed in the wafer, and an insulating layer 47, e.g. $SiO_2$, is provided on the upper surface of the wafer. Grooves 43, 45 are filled with glass or resin and metal leads 16, 18, 48 are applied as shown at FIG. 8B. The insulating layer 47 is selectively removed where the leads 16, 18, 48 contact the active circuitry 46. The top surface of the structure is coated with a thin layer of insulating resin 55, such as polyimide or epoxy, as shown at FIG. 8C. Wafer 37 is then thinned to expose moats 47 and cut or sawed to the proper length to form composite chip 46 as shown at FIG. 8D.

Figure 9A:
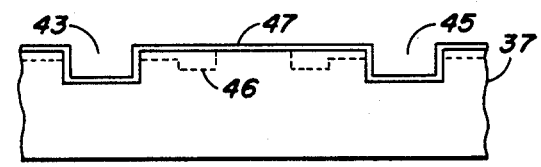
FIGS. 9(A-D) are side views illustrating a third exemplary manner of forming a single wafer chip in accordance with the present invention.
Figure 9B:
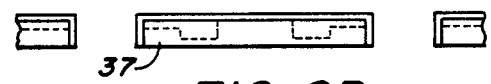
Figure 9C:
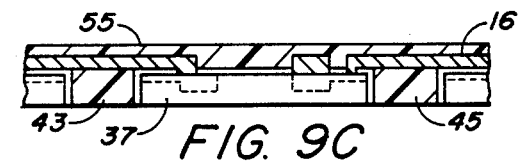
Figure 9D:
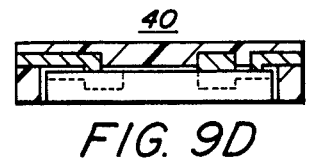

FIGS. 9A-D illustrate how the same composite chip 40 set forth in FIG. 9D may be formed utilizing a different sequence of construction steps. In the embodiment set forth at FIGS. 9A-D the wafer 37 is thinned to the required thickness prior to and filling the grooves 43, 45 with insulating material. When the wafer 37 is thinned prior to filling the grooves with an insulating material, the wafer must be supported on a base before groove filling to insure that the segments, then separated, as shown in FIG. 9B, remain in their proper relative position. The remaining portions of the construction of the embodiment shown at FIG. 10D is similar to that set forth in connection with FIGS. 8A-D.

As described above in connection with the illustrated embodiments, various techniques may be used to construct a moated chip in accordance with the present invention. The moated chip may be formed of a single wafer or pair of wafers bonded together as described. If desired, the chip may be formed to include more than two layers bonded together, with either separate or interconnected electrical circuit patterns as suitable for particular applications. The thickness of the layers and materials used to form the substrate or insulator filling may also be varied in accordance with the requirements of a particular application. Additionally, it is anticipated that the invention may have an application in fields other than infrared detection systems, such as in connection with data processing systems that consist of stacked and interconnected monolithic integrated circuit chips.

These and other modifications and substitutions may be effected to implement the structure and function of the component portions without departing from the spirit and scope of the invention.

What is claimed is:

1. A method of forming an integrated circuit chip from a wafer wherein the doped portions of the wafer are electrically isolated from edge portions thereof, comprising:
    forming a plurality of grooves in a wafer;
    selectively doping a first surface of the wafer;
    depositing insulating material within the grooves;
    forming conductive lead upon the first surface of said wafer, said conductive lead extending to and across at least a portion of said grooves;
    thinning the wafer such that said grooves extend the entire thickness of the wafer;
    trimming longitudinal edge portions of the wafer so that the length of the wafer is bounded by portions of said grooves and the insulating material therein; and
    depositing conductive material along the longitudinal edge portions of the wafer, said conductive material being in electrical communication with at least one of the conductive leads formed on the surface of the wafer, said conductive material being isolated by said insulating material from the wafer, except through said at least one of the conductive leads.

2. The method as recited in claim 1 wherein the step of depositing first insulating material within the grooves is performed before the step of thinning the wafer.

3. The method as recited in claim 1 wherein the step of depositing a first insulating material within the grooves is performed after the step of thinning the wafer.

4. The method as recited in claim 1 further comprising the step of applying a first insulating layer upon the first surface of the wafer prior to forming the conductive lead, and selectively etching the insulating layer to facilitate electrical communication between the conductive lead and the doped wafer surface.

5. The method as recited in claim 4 wherein the first insulating layer is formed to extend across substantially the length of the wafer.

6. The method as recited in claim 5 further comprising the step of applying a second layer of insulating material upon the wafer first surface.

7. The method as recited in claim 6 further comprising forming a plurality of said integrated circuit chips and disposing said chips in vertical array.

8. A method of making a multilayer monolithic electrical circuit structure upon a planar wafer which structure presents at, and in the plane of, an edge surface of said wafer (i) a butt end of a conductive lead at least partially bordered by (ii) insulating material, said method comprising:
providing a groove in the planar wafer;
providing a body of insulating material within the groove;
routing a conductive lead transversely onto the groove and upon the insulating material therein;
shaping the edge surface of the wafer at the location of said groove so that both (i) a butt end of the conductive lead and the (ii) insulating material of the moat are exposed on the edge surface of the wafer;
wherein the butt end of the conductive lead is at the edge surface bordered by the insulating material of the moat.

9. A wafer fabrication method of making an edge surface of a multilayer monolithic electrical circuit chip so that a butt end of a conductive lead is presented at the edge surface, the method comprising:
forming a groove in a planar surface of a wafer;
placing a first insulating material within the groove;
routing a plurality of conductive leads transversely onto the groove and upon the first insulating material thereof;
placing a second insulating material about any exposed surface of the plurality of conductive leads;
thinning the wafer until the first insulating material of the moat is exposed;
shaping a wafer edge surface along the groove and perpendicular to the plane of the wafer, therein exposing at the edge only the first insulating material and the second insulating material with butt ends of the plurality of conductive leads sandwiched therebetween.

10. A method of forming an integrated circuit chip suitable for abutting electrical connection to external electronics comprising:
forming a plurality of grooves in the surface of a semiconductive wafer having a length and a thickness, said grooves extending a portion of the thickness of the wafer;
depositing a layer of insulating material within the grooves;
forming active circuitry on a first surface of the wafer, said active circuitry including conductive leads, at least one of the conductive leads extending across at least a portion of the grooves;
thining the wafer so that the grooves extend the entire thickness of the wafer;
trimming the length of the wafer so that the length of the wafer is defined by the grooves; and
depositing a section of conductive material along a first edge surface of the wafer, said section of conductive material being effective to facilitate electrical communication between the conductive leads and external electronics.

11. The method as recited in claim 10 wherein the step of forming active circuitry includes doping a portion of the semiconductive wafer and applying said conductive leads to the first surface of the wafer, said at least one of said conductive leads being in electrical communication with said doped portions.

12. The method as recited in claim 10 wherein said step of trimming the length of the wafer includes the step of trimming a portion of the grooves and exposing an edge portion of said at least one of the conductive leads to facilitate electrical communication with the active circuitry.

13. The method as recited in claim 10 wherein the step of depositing a body of insulating material comprises filling the grooves to substantially the surface of the wafer with an insulating material.

14. The method as recited in claim 10 wherein the step of depositing a body of insulating material within the grooves comprises depositing a layer of silicon dioxide within the grooves.

15. The method as recited in claim 10 further including the step of depositing a body of insulating material upon the wafer first surface to encase the active circuitry.

16. The method as recited in claim 10 further including the step of depositing a layer of insulating material upon the wafer first surface and selectively removing portions of the insulating layer above at least one section of the active circuitry.

17. A method of forming an integrated circuit for abutting electrical connection to external electronics comprising:
forming a plurality of grooves in the surface of a semiconductive wafer, said wafer having a length, a thickness and an upper surface, said grooves extending a portion of the thickness of the wafer;
filling the grooves with a first body of insulating material;
forming doped semiconductor regions on the upper surface of the semiconductor material;
depositing a second body of insulating material along the upper surface of the wafer, said layer of insulating material covering said doped regions and extending across the insulating material within the grooves;
selectively applying conductive leads on the upper surface of the wafer, said leads being in electrical communication with said doped regions and extending across at least a portion of said body of insulating material;
selectively removing portions of the second body of insulating material adjacent the active doped regions;
thinning the wafer so that the grooves extend the entire thickness of the wafer;
trimming the length of the wafer so that lengthwise edges of the wafer are defined by the grooves and that at least one of said conductive leads are exposed at lengthwise edges of the wafer, and
depositing conductive material along the lengthwise edges of the wafers, said conductive material being in electrical communication with said at least one of said conductive lead and effective to facilitate electrical communication between the doped regions and external electronics.

18. A method of forming a single wafer integrated circuit for abutting electrical connection to external electronics comprising:
   forming a plurality of grooves in the surface of a semiconductive wafer, said wafer having a length, a thickness and an upper surface, said grooves extending a portion of the thickness of the wafer;
   filling the grooves with a first body of insulating material;
   forming doped semiconductor regions on the upper surface of the semiconductor material;
   depositing a second body of insulating material along the upper surface of the wafer, said layer of insulating material covering said doped regions and extending across the insulating material within the grooves;
   selectively removing portions of the second body of insulating material adjacent the active doped regions;
   selectively applying conductive leads on the upper surface of the wafer, said leads being in electrical communication with said doped regions, at least one of said leads extending across at least a portion of said body of insulating material;
   thinning the wafer so that the grooves extend the entire thickness of the wafer;
   trimming the length of the wafer so that lengthwise edges of the wafer are defined by the grooves and that at least one of said conductive leads is exposed at a lengthwise edge of the wafer; and
   depositing conductive material along the lengthwise edges of the wafers, said conductive material being in electrical communication with said at least one of said conductive leads and effective to facilitate electrical communication between the doped regions and external electronics.

* * * * *